(12) United States Patent
Zhang et al.

(10) Patent No.: US 10,347,331 B2
(45) Date of Patent: Jul. 9, 2019

(54) READ THRESHOLD OPTIMIZATION IN FLASH MEMORIES

(71) Applicant: SK Hynix Inc., Gyeonggi-do (KR)

(72) Inventors: Fan Zhang, Fremont, CA (US); June Lee, Sunnyvale, CA (US); David Pignatelli, Saratoga, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/620,179

(22) Filed: Jun. 12, 2017

(65) Prior Publication Data

US 2017/0358346 A1 Dec. 14, 2017

Related U.S. Application Data

(60) Provisional application No. 62/349,561, filed on Jun. 13, 2016.

(51) Int. Cl.
| | |
|---|---|
| *G11C 16/04* | (2006.01) |
| *G11C 11/56* | (2006.01) |
| *G11C 16/34* | (2006.01) |
| *G11C 29/02* | (2006.01) |

(52) U.S. Cl.
CPC ........ *G11C 11/5642* (2013.01); *G11C 16/349* (2013.01); *G11C 29/021* (2013.01); *G11C 29/028* (2013.01); *G11C 16/0483* (2013.01)

(58) Field of Classification Search
CPC ...................................................... G11C 16/04
USPC .................................................... 365/185.03
See application file for complete search history.

(56) References Cited

U.S. PATENT DOCUMENTS

| | | | |
|---|---|---|---|
| 2012/0008414 A1* | 1/2012 | Katz | G11C 16/26 365/185.24 |
| 2014/0281767 A1 | 9/2014 | Alhussien | |
| 2015/0052408 A1 | 2/2015 | Lee | |
| 2015/0078084 A1 | 3/2015 | Lee | |
| 2016/0133334 A1 | 5/2016 | Zhang | |

* cited by examiner

*Primary Examiner* — Hoai V Ho
(74) *Attorney, Agent, or Firm* — Kilpatrick Townsend & Stockton

(57) ABSTRACT

A memory device includes a plurality of memory blocks, each block with multiple memory cells. Each memory block has an address and a block read threshold. The plurality of memory blocks is partitioned into clusters based on block read thresholds. The memory device also has a look-up table for storing information associating each cluster of memory blocks with a corresponding cluster read threshold. The look-up table further includes cluster boundaries defined in values of device status parameters. The memory device is configured to receive a read command to read a memory block with a read address and identify a cluster for the memory block with the read address. The memory device is also configured to select a cluster read threshold for the identified cluster from the look-up table, and use the selected cluster read threshold to perform a read operation of the memory block.

25 Claims, 10 Drawing Sheets

| Block No. | Address | Optimal Read Threshold | Status Parameters ||||
|---|---|---|---|---|---|---|
| | | | P1 | P2 | ..... | PM |
| 1 | ADDR-1 | T1 | P11 | P21 | ..... | PM1 |
| 2 | ADDR-2 | T2 | P12 | P22 | | |
| 3 | ADDR-3 | T3 | ..... | ..... | | ..... |
| ..... | ..... | ..... | ..... | ..... | | ..... |
| N-1 | ADDR-(N-1) | T(N-1) | ..... | | | ..... |
| N | ADDR-N | TN | P1N | P2N | | PMN |

FIG. 4

| Cluster No. | Cluster Read Threshold | Status Parameters | | | |
|---|---|---|---|---|---|
| | | P1 | P2 | ..... | PM |
| 1 | $T_1 = [t1_1, t1_2, \ldots, t1_J]$ | P11$L$ - P11$H$ | P21$L$ - P21$H$ | ..... | PM1$L$ - PM1$H$ |
| 2 | $T_2 = [t2_1, t2_2, \ldots, t2_J]$ | P12$L$ - P12$H$ | P22$L$ - P22$H$ | | |
| 3 | ..... | ..... | ..... | | ..... |
| ..... | ..... | ..... | ..... | | ..... |
| K-1 | ..... | ..... | | | ..... |
| K | $T_N = [tK_1, tK_2, \ldots, tK_J]$ | P1K$L$ - P1K$H$ | P2K$L$ - P2K$H$ | ..... | PMK$L$ - PMK$H$ |

FIG. 7

FIG. 8  Method for building Table

READ THRESHOLD OPTIMIZATION IN FLASH MEMORIES

CROSS-REFERENCES TO RELATED APPLICATIONS

This application claims priority to U.S. Provisional Patent No. 62/349,561, filed Jun. 13, 2016, commonly owned and incorporated by reference in its entirety.

This application is also related to U.S. patent application Ser. No. 15/214,161, filed Jul. 19, 2016 and U.S. patent application Ser. No. 14/936,340, filed Nov. 9, 2015, both of which are commonly owned and incorporated by reference in their entirety.

BACKGROUND OF THE INVENTION

The present invention relates generally to methods, and apparatus for storage devices, and specifically to improving performance of non-volatile memory devices. More particularly, embodiments of the present invention provide a hard-read threshold optimization technique which can increase the hard-read ECC performance of non-volatile memory devices.

Non-volatile memory devices such as Solid State Drives (SSDs) are finding new applications in consumer electronics. For example, they are replacing Hard Disk Drives (HDDs), which typically comprise rapidly rotating disks (platters). Non-volatile memories, sometimes referred to as 'flash memories' (for example, NAND and NOR flash devices) are used in media storage, cameras, mobile phones, mobile computers, laptop computers, USB flash drives, etc. Non-volatile memory provides a relatively reliable, compact, cost-effective, and easily accessible method of storing data when the power is off.

In NAND flash memories, information is stored by cell levels. A read is performed by comparing a read threshold to the cell voltage. For example, if the cell voltage is higher than the read threshold, we get a 0, otherwise a 1, as a read result. To get soft information for better error correction performance, multiple rounds of reads, or a soft-read, are needed. To make sure most of data can be retrieved from a solid state disk within a certain amount of time, the soft-read can only be triggered with certain small probability. For example, in enterprise applications, soft-read can only be triggered with a probability lower than 0.01% or 0.001%. If the triggering rate of soft-read is higher, customers often consider the SSD as having deteriorated and having reached its end-of-line (EOL) and will replace the drive. Therefore, the hard-read ECC performance plays an important role in determining the life span of an SSD.

BRIEF SUMMARY OF THE INVENTION

In embodiments of the present invention, it has been determined that the hard-read ECC performance highly depends on how the default read threshold is chosen. Embodiments of the present invention provide a hard-read threshold optimization technique which can increase the hard-read ECC performance and hence the life span of an SSD significantly. In some embodiments, an optimal block read threshold is determined for each memory block. The memory blocks are then clustered according to their optimal block read thresholds. Next, an optimal cluster read threshold is determined for each cluster, and each memory block is read using the optimal cluster read threshold. As a result, the hard-read threshold can be optimized. The number of clusters is much lower than the number of memory blocks. Therefore, the overhead of tracking the optimal read thresholds can be reduced.

According to some embodiments of the present invention, a memory device includes a plurality of memory blocks. Each memory block has multiple non-volatile memory cells, and each memory block has a read threshold for reading the memory cells. The plurality of memory blocks is partitioned into clusters of memory blocks based on the read threshold for each memory block. The memory device includes a look-up table for storing information associating each cluster of memory blocks with a corresponding cluster read threshold and a parameter table for storing a plurality of status parameters for each memory block. The plurality of status parameters can include, e.g., a first count of cumulative read operations and a second count of cumulative write operations. The memory device is configured to receive a read command for reading a memory block with a first address, retrieve the plurality of status parameters associated with the memory block from the parameter table, and select a cluster read threshold from the look-up table based on the plurality of status parameters and the first address. Next, the memory device uses the selected cluster read threshold to read the memory block.

According to some embodiments of the present invention, a memory device includes a plurality of memory blocks, each block with multiple memory cells. Each memory block has an address and a block read threshold. The plurality of memory blocks is partitioned into clusters based on block read thresholds. The memory device also has a look-up table for storing information associating each cluster of memory blocks with a corresponding cluster read threshold. The look-up table further includes cluster boundaries defined in values of device status parameters. The memory device is configured to receive a read command to read a memory block with a read address and identify a cluster for the memory block with the read address. The memory device is also configured to select a cluster read threshold for the identified cluster from the look-up table, and use the selected cluster read threshold to perform a read operation of the memory block. In some embodiments, the memory device can also include a parameter table for storing a plurality of device status parameters for each memory block.

According to some embodiments of the present invention, a method for a hard-read of a NAND flash memory includes building a look-up table of optimal read thresholds for clusters of memory blocks. The method includes performing read operations of a plurality of memory blocks using different read thresholds to determine an optimum block read threshold for each memory block. Each memory block is characterized by multiple status parameters. The method also includes clustering the plurality of memory blocks into a group of clusters according to the optimum block read threshold for each memory block. For each cluster, the method also determines a cluster read threshold and identifies cluster boundaries in values of the status parameters.

In some embodiments, the method can also include receiving a read command with an address for a memory block, identifying a cluster index for the memory block, identifying a cluster read threshold associated with the cluster index, and performing a read operation of the memory block using the cluster read threshold.

In some embodiments, the method can also include receiving a read command with an address for a memory block, identifying a cluster index for the memory block based on the status parameters of the memory block, identifying a cluster read threshold associated with the cluster index, and performing a read operation of the memory block using the cluster read threshold.

In some embodiments, the method can also include forming a parameter table for storing a plurality of status parameters for each memory block. The plurality of status parameters can include a first count of cumulative read operations and a second count of cumulative read operations. The method can also include forming a look-up table for storing information associating each cluster of memory blocks with a corresponding cluster read threshold. The plurality of memory blocks is partitioned into clusters of memory blocks based on read threshold.

In some embodiments, the method can further include updating a status parameter associated with a read operation. In some embodiments, the method for determining optimum read threshold for each memory block includes selecting a read threshold for minimizing a raw bit error rate (rBER).

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

FIG. 4 is a diagram illustrating a parameter table listing device status parameters for each memory block according to some embodiments of the present invention;

FIG. 7 is a diagram illustrating a look-up table listing read thresholds for each cluster of device blocks and the cluster boundaries based on device status parameters according to some embodiments of the present invention;

DETAILED DESCRIPTION OF THE INVENTION

Figure 1:
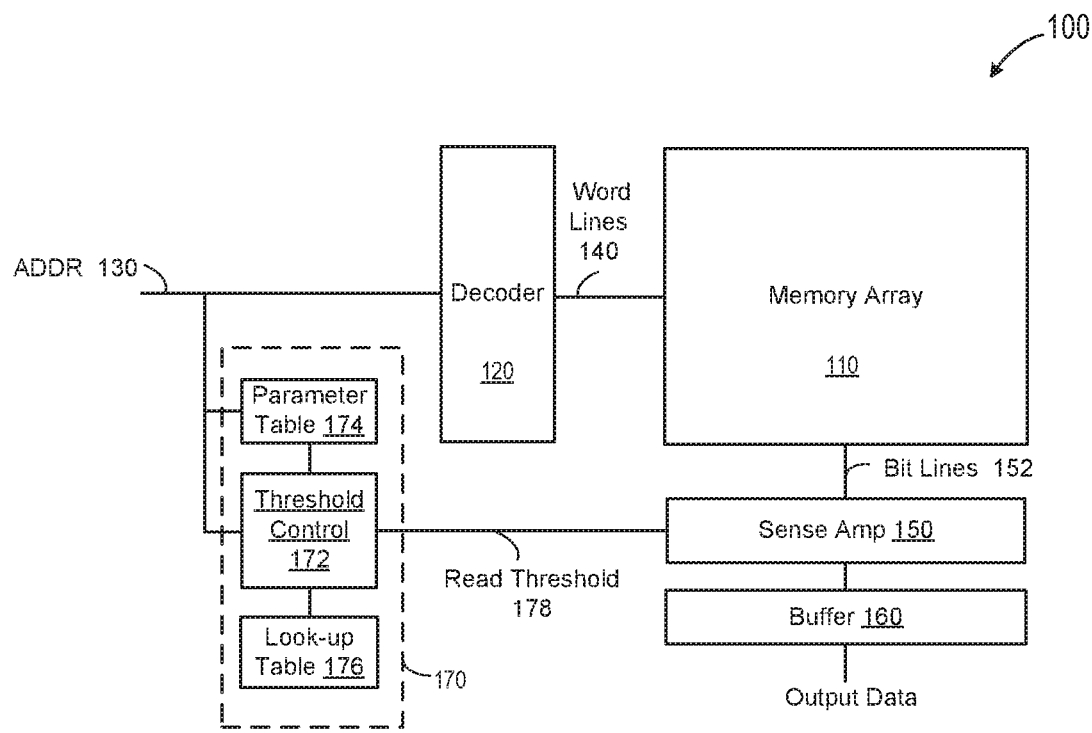
FIG. 1 is a simplified block diagram illustrating a memory device according to an embodiment of the present invention.

FIG. 1 is a simplified block diagram of a memory device according to an embodiment of the present invention. In this example, a flash memory device 100 includes a memory cell array 110 having a plurality of non-volatile memory cells. In some embodiments, the memory cells are arranged in a plurality of memory blocks. Each memory block can include multiple non-volatile memory cells, and each memory block being associated with a corresponding address. Memory device 100 also includes a decoder 120, for example a row decoder. In an example, decoder 120 receives a command for a memory operation with an address ADDR 130, e.g., a read command with a read address. The address 130 can be a logic block address. In an embodiment, the memory operations, such as read, write, erase, etc., are directed to a memory block, for example a page or a sector. Depending on the embodiment, a page or a sector can be 0.5 Kbytes to 4 Kbytes, or a block of a different size. In this case, decoder 120 produces word lines (WL) 140 based information on ADDR 130 for selecting a memory block, which can be a row of memory cells coupled to the selected word line.

A sense amplifier block 150 is coupled to memory cell array 10 through bit lines 152. A buffer block 160 is coupled to sense amplifier block 150 and provides output data to an external device. In a read operation, sense amplifier block 150 senses the data stored in each memory cell of the memory cell array 110 and provides the data to buffer block 160. In a write or program operation, buffer block 160 presents the data to be written or programmed to the memory array 110.

During a memory read operation, the charges in a non-volatile memory cell selected by a word line are read out. Depending on the charges stored in a memory cell, its cell threshold voltage can vary. A read voltage higher than cell threshold voltage can be used to determine the data stored in the memory cell. In some embodiments, each of the multiple non-volatile memory cells is a three-level non-volatile memory cell (TLC). In this case, a read threshold can include seven threshold voltage values to determine the values of the three data bits.

Figure 2:
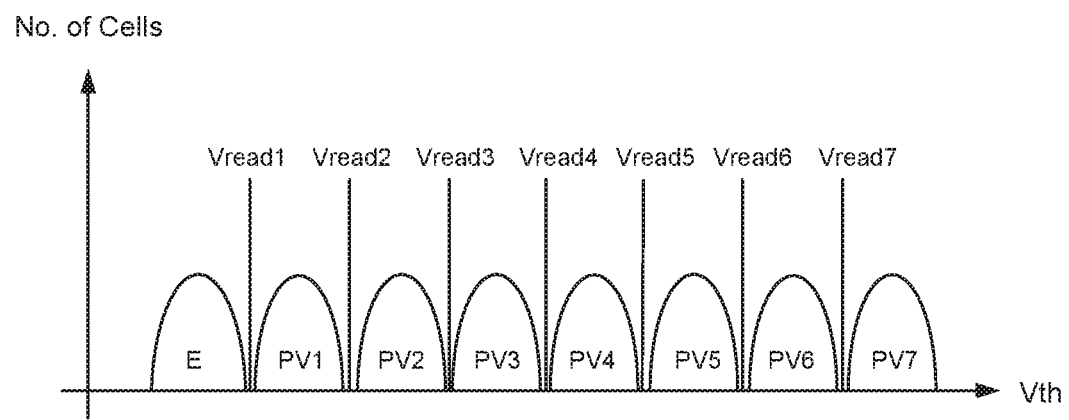
FIG. 2 is a simplified diagram illustrating a distribution of read thresholds of a memory device having 3 bit levels in a flash memory device according to some embodiments of the present invention.

FIG. 2 is a simplified diagram illustrating a distribution of read thresholds of a memory device having three bit levels in a flash memory device according to some embodiments of the present invention. In FIG. 2, the cell threshold voltages for an erase state "E" and seven programmed states "PV1" to "PV7" are shown. The spread in cell threshold voltage is caused by differences in cell characteristics and operation history. Also shown in FIG. 2 are seven read thresholds, labeled as "Vread1," "Vread2," ..., and "Vread7," which are used to determine the data stored in the memory cell.

In current SSD (solid state disk) firmware implementations, a threshold setting is used as default for the hard-reads for all pages in the whole SSD. Some improved schemes allow a default threshold setting for each die. However, by looking at the measurement data from real NAND, the inventors have found that die-to-die variation may not be as significant as the variation caused by different word lines and erase-write (EW) cycles. For example, from the measurement data, there can be about 50% differences in terms of the raw BER (rBER—raw bit error rate) from two threshold placement schemes which either consider or do not consider WL variations, respectively. Another factor that can affect rBER is the EW cycles. The inventors have seen strong correlations between the optimal read thresholds and EW cycles. One reason is that the NAND cell becomes easier to program as the number of EW cycles increases, which makes the first threshold (the one between erase state and PV1) shift to the right, i.e., increase, as EW increases.

Figure 3:
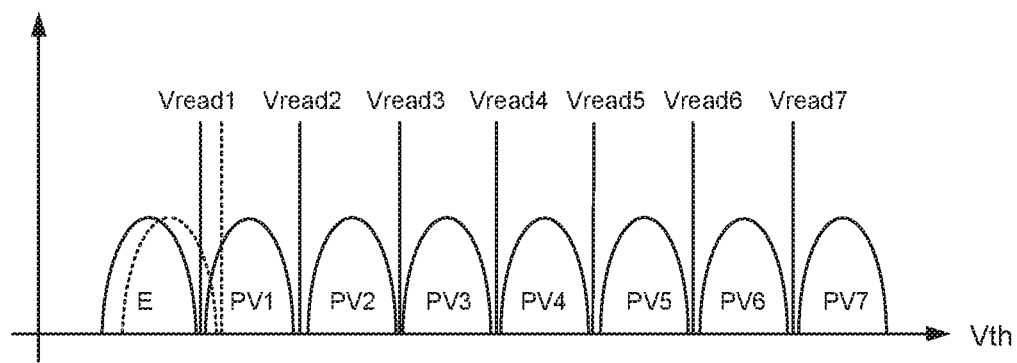
FIG. 3 is a simplified diagram illustrating a shift in the distribution of read thresholds of a memory device according to some embodiments of the present invention.

FIG. 3 is a simplified diagram illustrating a shift in the distribution of cell threshold voltages and read thresholds of a memory device according to some embodiments of the present invention. The solid line drawings illustrate cell threshold voltages for an erase state "E" and seven programmed states "PV1" to "PV7" and seven read thresholds, labeled as "Vread1," "Vread2," . . . , and "Vread7," of a memory cell, similar to those shown in FIG. 2. After a number of erase-write cycles, cell threshold voltages and the optimum read threshold for the first bit level are shifted to the right.

Another factor that can cause the right-shift of the first threshold is the read disturbance. Read disturbance can make the erase state move to the right. Data retention can also affect the threshold by shifting the distribution. It can be shown that the data in the same block will have similar retention time, or data temperature. For a 3D NAND memory, another factor that can cause cell distribution change is the early retention issue. To track if a WL has early retention issues, a status bit can be used to indicate whether a WL was programmed in the past 10 minutes, e.g., 0 means no early retention and 1 means early retention.

The cell threshold can also shift as a result of changes in data block temperature. A block temperature can be defined in terms of the probability of being accessed. For example a data block that is accessed frequently can be called a hot block, and a data block that has not been accessed in some time can be called a cold block. Therefore, the length of time since the last access, either read or write, can be a status parameter that can cause the cell threshold voltage to shift.

Based on these observations, embodiments of the invention provide a method for selecting the default read threshold based on EW cycle, WL index, block temperature, early retention indicator, and number of reads in the block, etc.

Based on these memory status parameters, the optimal read threshold can be determined for each data block by measuring the NAND memory device. For example, an optimal read threshold for a data block can be determined by repeatedly measuring a block of memory cells using different read thresholds. Here each read threshold can include multiple read threshold voltage values, for example, Vread1 to Vread 7 as shown in FIGS. 2 and 3. The optimal read threshold for each data block is selected to the set of read threshold voltage values for which the raw bit error rate (rBER) is the lowest. Based on measured data, the optimal read threshold for a data block can be correlated to a list of status parameters associated with that memory block. An example is described below in connection with FIG. 4.

FIG. 4 is a diagram illustrating a parameter table listing device status parameters for each memory block according to some embodiments of the present invention. As shown in FIG. 4, the parameter table lists a number of data blocks, numbered 1, 2, 3, . . . , and N, and addresses for each data block, ADDR-1, ADDR-2, ADDR-3, ADDR-N. In some embodiments, the addresses for the data blocks can be word line (WL) numbers. Also listed are the optimal read threshold T1, T2, T3, . . . , and TN for each block determined by testing and measurement as described above. The parameter table also lists values of the status parameters for each data block. The status parameters, P1, P2, . . . , and PM can include on EW cycle, WL index, block temperature, early retention indicator, and number of reads in the block, etc. In FIG. 4, status parameter value Pij, where i and j are integers, represents the value of the ith status parameter for the jth data block. For example, P11=3.5K can mean that data block #1 has a cumulative read operation count of 3.5K. The parameter table can also include a count of cumulative write operations, etc.

In practice, the number of combinations of the status parameters is large, and the table of optimal read thresholds can be large. For example, the memory device may have an EW cycle from 0 to 7K. If the device is characterized with a resolution of, for example, 10 cycles, then, there can be seven hundred points on that dimension. The parameter table can include tens of status parameters, each with a large data dimension. The size of the parameter table can increase exponentially with the number of status parameters. As a result, the overhead of tracking optimal read threshold with many status parameters can be large, and the tracking would be impractical to implement.

In some embodiments, the whole status parameter space can be divided into a limited number of clusters, and the optimal threshold setting for each cluster is determined by offline optimization. In other words, memory blocks in the same cluster are read with an optimal cluster read threshold for the sector. As a result, the list or table of optimal read thresholds can be reduced. Further, boundaries of the clusters can be determined in terms of the status parameters described above.

Figure 5:
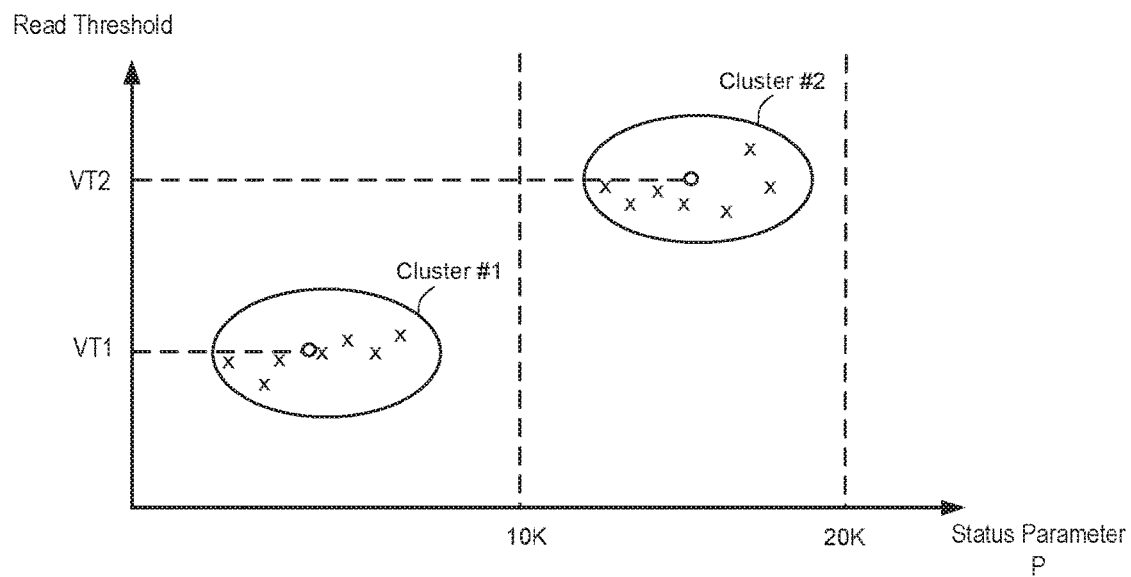
FIG. 5 is a simplified diagram illustrating a method of read threshold clustering based on a device status parameter according to some embodiments of the present invention.

FIG. 5 is a simplified diagram illustrating a method of read threshold clustering based on a device status parameter according to some embodiments of the present invention. In FIG. 4, the horizontal axis represents a memory block status parameter P, which can be any one of device status parameters such as EW cycle, WL index, block temperature, early retention indicator, and number of reads in the block, etc. The vertical axis represents the optimal read threshold for each data block represented by an "X." It can be seen that two clusters are formed, Cluster #1 and Cluster #2. Cluster #1 has an optimal cluster read threshold VT1, and Cluster #2 has an optimal cluster read threshold VT2. The boundaries that divide the clusters have the status parameter P with values 10K and 20K. For example, a certain cluster read threshold VT1 is used for data blocks with less than 10K read cycles, less than 10K write cycles, etc. Similarly, a second cluster read threshold VT2 is used for data blocks with 10K-20K read cycles, less than 10K-20K write cycles, etc.

Figure 6:
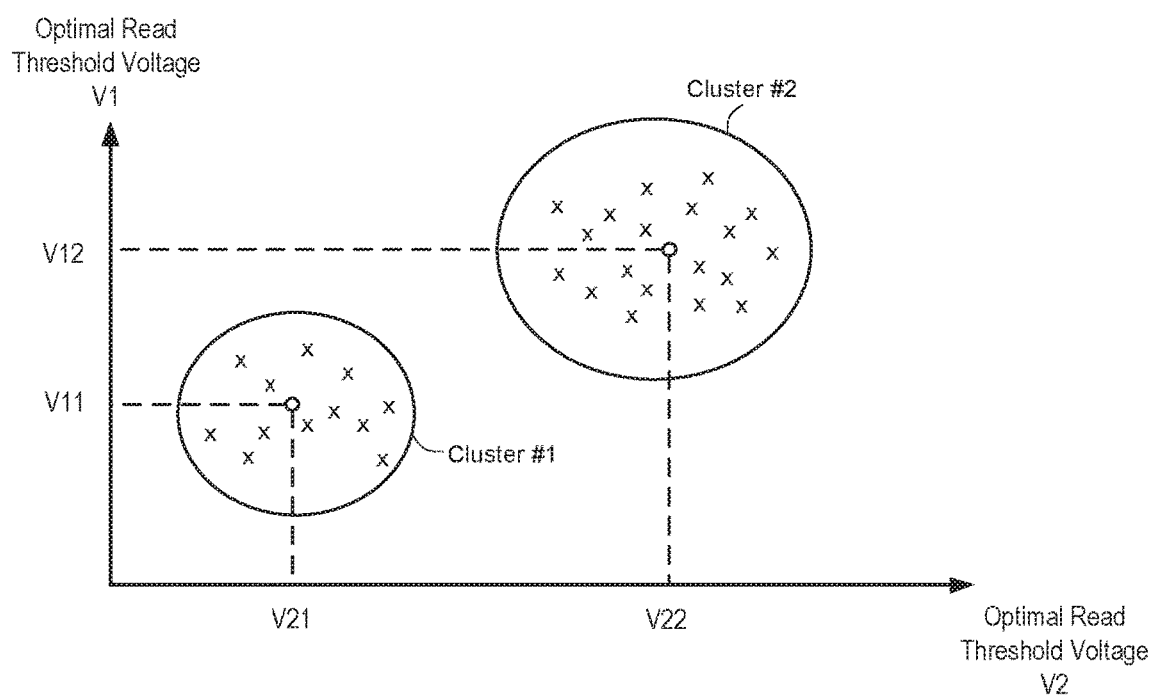
FIG. 6 is a simplified diagram illustrating a method of read threshold clustering based on device status parameters according to alternative embodiments of the present invention.

FIG. 6 is a simplified diagram illustrating a method of read threshold clustering based on device status parameters according to alternative embodiments of the present invention. In this example, the memory blocks can have multi-level memory cells, with each read threshold having multiple read threshold voltage values. For example, the read threshold for a 3-bit memory cell has seven read threshold voltage values. To simplify the illustration, FIG. 5 only shows has two read threshold values for each read threshold setting. The vertical axis represents a first read threshold value V1, and the horizontal axis represents the second read threshold value V2. It can be seen that two clusters are formed, Cluster #1 and Cluster #2. Further, Cluster #1 has an optimal cluster read threshold (V11, V21), and Cluster #2 has an optimal cluster read threshold (V12, V22). The clustering process also identifies the boundaries that separate the clusters in terms of the status parameters. For example, memory blocks in Cluster #1 may have less than a 10K count of cumulative read operations, less than a 10K count of cumulative write operations, etc. Similarly, memory blocks in Cluster #2 may have a 10K-20K count of cumulative read operations, a 10K-20K count of cumulative write operations, etc.

In a data block of multi-level memory cells, each read threshold includes multiple read threshold voltage values. For example, in a 3-bit memory cell, each read threshold can have the form $T_1=[t1_1, t1_2, \rule{1em}{0.4pt}, t1_7]$. The parameter table can be used to form clusters using a known clustering method. For example, in k-means clustering, n data points are grouped into k clusters in which each data point belongs to the cluster with the nearest mean. Applying the clustering algorithm to the read thresholds in the parameter table of FIG. 4, the distance between two threshold settings $T_1=[t1_1, t1_2, \ldots, t1_7]$ and $T_2=[t2_1, t2_2, \ldots, t2_7]$ can be chosen as their $l_1$ distance, or $d(T_1, T_2)=\Sigma_{i=1}^{7}|t1_i-t2_i|$. The k-means clustering groups the N read thresholds in FIG. 4 into K clusters in which each read threshold belongs to the cluster with the nearest mean. In other words, the distance between the read threshold and a cluster mean is minimized.

The optimal cluster read threshold can be the mean read threshold determined in the clustering process. In other embodiments, the cluster read threshold for each cluster can be determined by minimizing an average rBER of each cluster:

$$T_{opt}(k)=\arg\min\nolimits_{T}\Sigma_i^{N(k)}(\text{rBER(LSB)}(i)+\text{rBER(CSB)}(i)+\text{rBER(MSB)}(i)),$$

wherein:

$T_{opt}(k)$ is an optimum cluster read threshold for the cluster;

rBER is the raw bit error rate;

"arg min" is "argument of the minimum," which is a function that determines a value of read threshold T for which the bit error rate for the cluster as defined above is minimum;

N(k) is a number of word lines in the k-th cluster;

LSB refers to least significant bit;

CSB refers to center significant bit; and

MSB refers to most significant bit.

In the above equation, the "arg min" function can be evaluated using conventional methods.

The method and device described herein may be applied to different types of flash memory technology, such as single-level cell (SLC), multi-level cell (MLC), and triple-level cell (TLC). For example, for TLC flash memory, the bit error rate may be different depending on whether a particular data block is part of a least-significant bit (LSB) page, a center-significant bit (CSB) page, or a most-significant bit (MSB) page. Therefore, in some embodiments, the BERs of LSB, CSB, and MSB pages are calculated separately in selecting the optimal cluster read threshold as described above.

Further, the boundary of each cluster is defined by the range of each status parameter. A look-up table can be formed a look-up table for storing information associating each cluster of memory blocks with a corresponding cluster read threshold for the cluster. FIG. 7 is a diagram illustrating a look-up table listing read thresholds for each cluster of device blocks and the cluster boundaries based on device status parameters according to some embodiments of the present invention. It can be seen in FIG. 7 that for each cluster numbered 1 through K, a cluster read threshold T is listed, along with ranges of values for each status parameter that defines the cluster. For example, for cluster K, the look-up table lists a cluster read threshold $T_1=[t1_1, t1_2, \ldots, t1_7]$, along with ranges of values P1KL-P1KH, P2KL-P2KH, ..., and PMKL-PMKH for status parameters P1, P2, ..., and PM, respectively. PMKL is the lower value of status parameter PM for cluster K, and PMKH is the higher value of status parameter PM for cluster K. As an example, the ranges of values for status parameters that define the boundary of a cluster can include the following:

EW from 0K to 1.3K;

WL index 1 to 10; block temperature between 1 M and 3 M;

Early retention indicator=0; and

Read disturbance between 1K to 10K.

Figure 8:
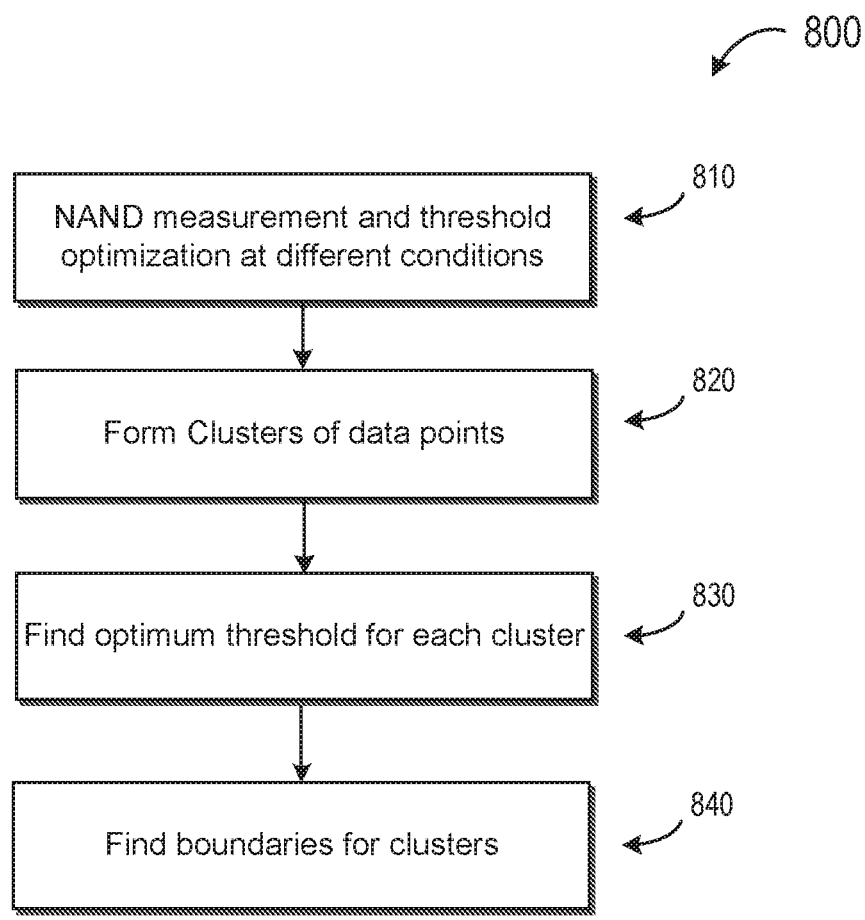
FIG. 8 is a simplified flowchart illustrating an offline optimization method for building a look-up table for a memory device according to some embodiments of the present invention.

The method for building a look-up table for hard-read of a flash memory device described above can be summarized in a flowchart. FIG. 8 is a simplified flowchart illustrating an offline optimization method for building a look-up table for a memory device according to some embodiments of the present invention. A method 800 for building a look-up table for hard-read of a flash memory includes providing a plurality of memory blocks. Each memory block is characterized by multiple status parameters. The method includes performing hard-read operations of a plurality of memory blocks using different read thresholds to determine an optimum read threshold for each memory block (810). The method further includes clustering the plurality of memory blocks into a group of clusters according to the optimum read threshold for each memory block (820). For each cluster, an optimal cluster read threshold is determined (830). For each cluster, cluster boundaries are determined in values of the status parameters (840).

In some embodiments, the look-up table building process can be separated from the data measurement and gathering process. For example, data can be gathered by testing many solid state drives, and the data gathered is then operated on by one or more offline servers using the clustering algorithm to form the clusters.

The look-up table described above can be used for hard read operations. During run-time, based on the status parameters of a data block, a cluster index or cluster number can be determined that identifies the cluster to which the data block belongs. Then the optimal cluster read threshold setting can be determined from the look-up table, and a hard-read can be performed using the optimal cluster read threshold setting.

In embodiments of the invention, the optimal read threshold clustering can be implemented using memory device 100 in FIG. 1. Referring to FIG. 1, memory device 100 has a control block 170 including a threshold control circuit 176, a parameter table 172, and a look-up table 176. Parameter table 172 stores the memory device status parameters for the memory blocks in memory array 110. For example, the plurality of status parameters can include a first count of cumulative write operations and a second count of cumulative read operations. The plurality of memory blocks in memory array 110 is divided into clusters of memory blocks based on read thresholds as described above. Look-up table 160 stores information associating each cluster of memory blocks with a corresponding optimal cluster read threshold for the cluster. In look-up table 176, each cluster is identified by a cluster number or cluster index. Memory device 100 is configured to perform hard read operations as summarized in the flowchart of FIG. 9.

Figure 9:
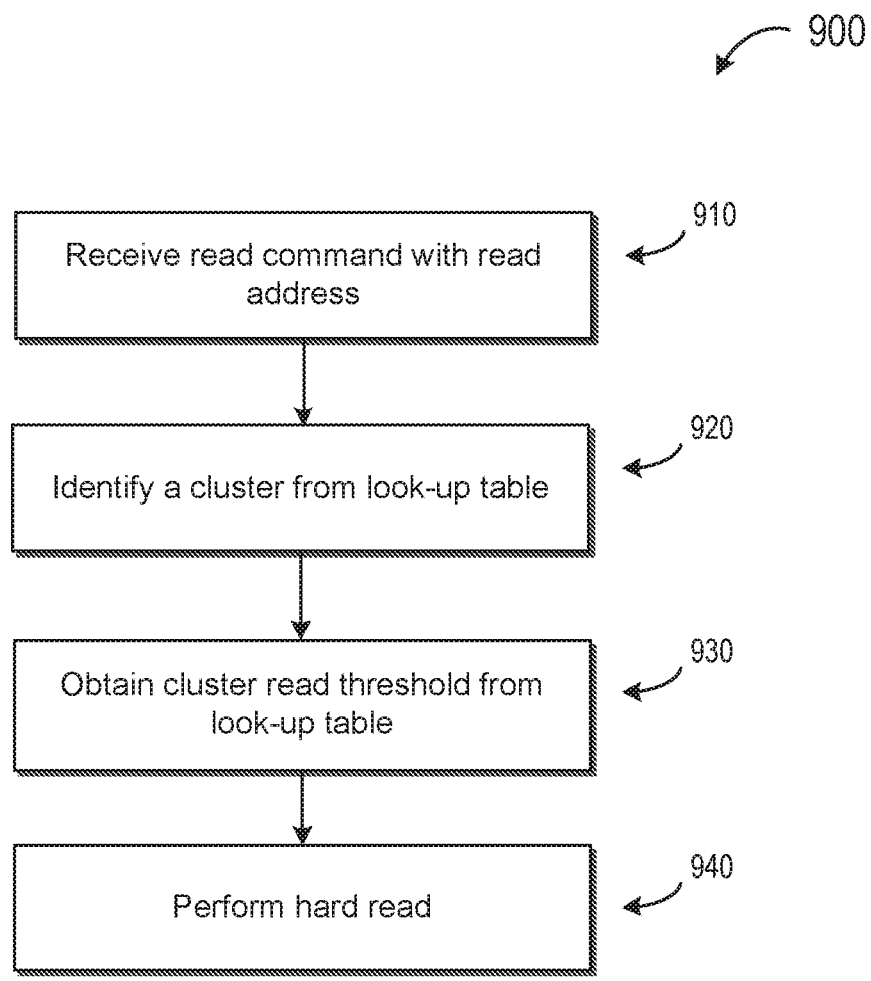
FIG. 9 is a simplified flowchart illustrating a method for run-time read operation for a memory device according to an embodiment of the present invention.

FIG. 9 is a simplified flowchart 900 illustrating a method for run-time read operation for a memory device according to an embodiment of the present invention. The method includes receiving a read command for reading a memory block with a first address (910). Depending on the embodiments, the memory block can include a page of memory cells or a sector of memory cells. In some embodiments, the block of memory cells may be addresses with a word line (WL). The method includes identifying a cluster in the look-up table associated with the first address (920). For example, the memory device can retrieve a cluster index or a cluster number associated with the first address. In some embodiments, the memory device can retrieve a plurality of status parameters associated with the memory block from the parameter table. Next, an optimal cluster read threshold can be selected from the look-up table based on the status parameters and the first address (930). The selected optimal cluster read threshold is then used to perform a hard read of the memory block (940).

In some embodiments, the memory device is further configured to, after the read operation, update the count of cumulative read operations in the parameter table.

In some embodiments, each of the multiple non-volatile memory cells is a 3-bit non-volatile memory cell, and a read threshold can include seven threshold voltage values.

In memory device 100, threshold control circuit 172 is configured to receive ADDR 130 for a read command and access parameter table 174 and look-up table 176 to select a proper read threshold 178 for the data block pointed to by the address in ADDR 130. The selected read threshold 178 is then provided to sense amplifier block 150 for reading the selected data block. In a 3-bit non-volatile memory device, the read threshold can include seven threshold voltages. Memory device 100 may include a number of internal voltage reference circuits for providing the different threshold voltages, and a switching circuit may be used to select the proper threshold voltages. Parameter table 174 and look-up table 176 may be implemented using volatile or non-volatile memories. Depending on the embodiments, threshold control circuit 172 may be implemented using logic circuits or a combination of circuits and software components.

According to embodiments of the invention, a hard-read threshold optimization technique is described above. A clustering of memory blocks is used to identify the optimal cluster read threshold for each cluster of memory blocks. A large number of memory blocks can share a common optimal cluster read threshold that minimizes the bit error rate for the cluster. The size of the look-up table for optimal cluster read thresholds can be reduced. Therefore, hard read performance can be improved.

The method and device described above can increase the hard-read ECC performance and hence the life span of an SSD significantly. For example, in an embodiment, the method can provide 50% improvement on the hard-read rBER of a NAND memory.

The embodiments disclosed herein are not to be limited in scope by the specific embodiments described herein. Various modifications of the embodiments of the present invention, in addition to those described herein, will be apparent to those of ordinary skill in the art from the foregoing description and accompanying drawings. Further, although some of the embodiments of the present invention have been described in the context of a particular implementation in a particular environment for a particular purpose, those of ordinary skill in the art will recognize that its usefulness is not limited thereto and that the embodiments of the present invention can be beneficially implemented in any number of environments for any number of purposes.

Figure 10:
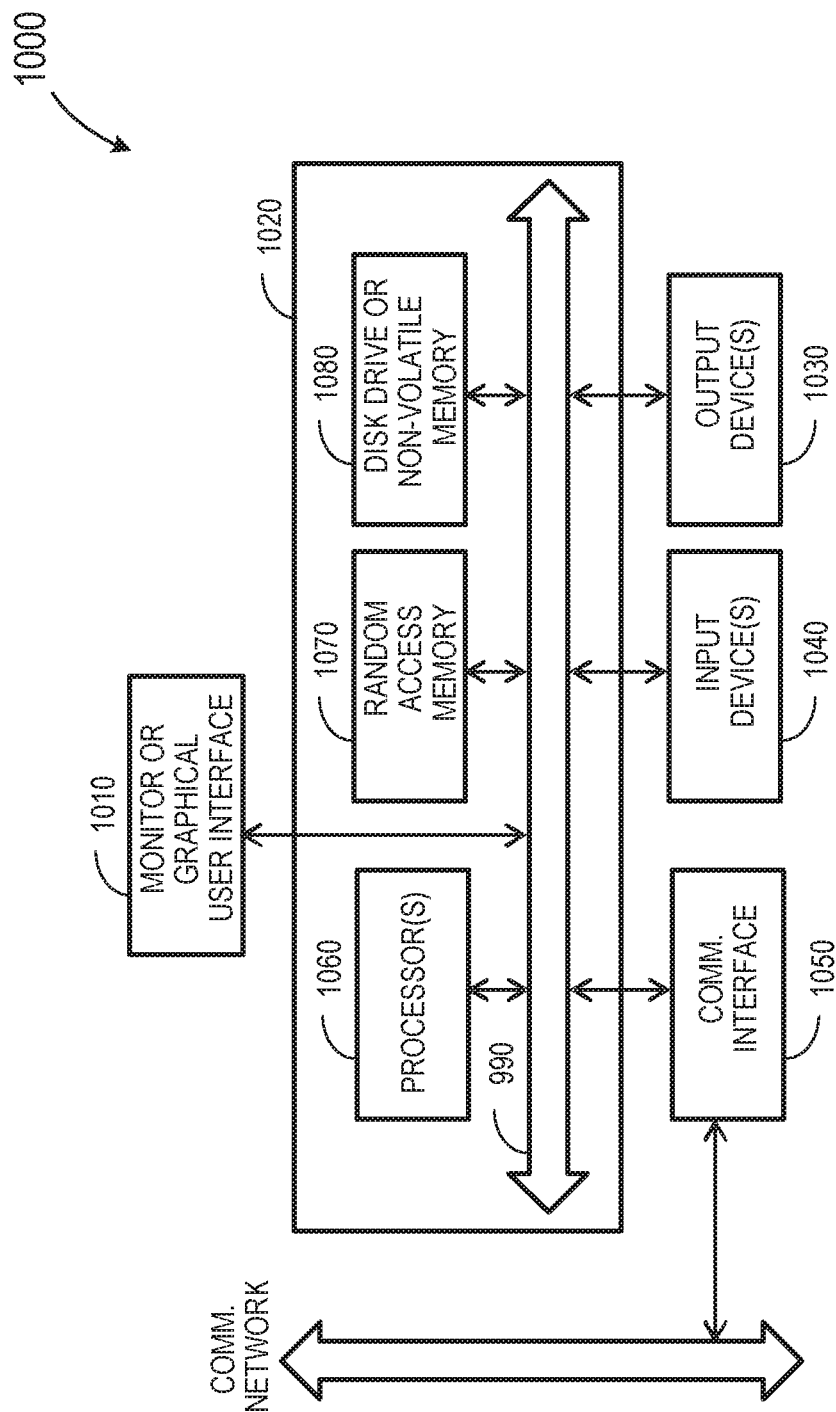
FIG. 10 is a simplified block diagram illustrating an apparatus that may be used to implement various embodiments according to the present invention.

FIG. 10 is a simplified block diagram illustrating an apparatus that may be used to implement various embodiments according the present disclosure. FIG. 10 is merely illustrative of an embodiment incorporating the present disclosure and does not limit the scope of the disclosure as recited in the claims. One of ordinary skill in the art would recognize other variations, modifications, and alternatives. In one embodiment, computer system 1000 typically includes a monitor 1010, a computer 1020, user output devices 1030, user input devices 1040, communications interface 1050, and the like.

As shown in FIG. 10, computer 1020 may include a processor(s) 1060 that communicates with a number of peripheral devices via a bus subsystem 1090. These peripheral devices may include user output devices 1030, user input devices 1040, communications interface 1050, and a storage subsystem, such as random access memory (RAM) 1070 and disk drive 1080.

User input devices 1040 can include all possible types of devices and mechanisms for inputting information to computer system 1020. These may include a keyboard, a keypad, a touch screen incorporated into the display, audio input devices such as voice recognition systems, microphones, and other types of input devices. In various embodiments, user input devices 1040 are typically embodied as a computer mouse, a trackball, a track pad, a joystick, wireless remote, drawing tablet, voice command system, eye tracking system, and the like. User input devices 1040 typically allow a user to select objects, icons, text and the like that appear on the monitor 1010 via a command such as a click of a button or the like.

User output devices 1030 include all possible types of devices and mechanisms for outputting information from computer 1020. These may include a display (e.g., monitor 1010), non-visual displays such as audio output devices, etc.

Communications interface 1050 provides an interface to other communication networks and devices. Communications interface 1050 may serve as an interface for receiving data from and transmitting data to other systems. Embodiments of communications interface 1050 typically include an Ethernet card, a modem (telephone, satellite, cable, ISDN), (asynchronous) digital subscriber line (DSL) unit, FireWire interface, USB interface, and the like. For example, communications interface 1050 may be coupled to a computer network, to a FireWire bus, or the like. In other embodiments, communications interfaces 1050 may be physically integrated on the motherboard of computer 1020, and may be a software program, such as soft DSL, or the like.

In various embodiments, computer system 1000 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, computer 1020 includes one or more Xeon microprocessors from Intel as processor(s) 1060. Further, in one embodiment, computer 1020 includes a UNIX-based operating system.

RAM 1070 and disk drive 1080 are examples of tangible storage media configured to store data such as embodiments of the present disclosure, including executable computer code, human readable code, or the like. Other types of tangible storage media include floppy disks, removable hard disks, optical storage media such as CD-ROMS, DVDs and bar codes, semiconductor memories such as flash memories, read-only-memories (ROMS), battery-backed volatile memories, networked storage devices, and the like. RAM 1070 and disk drive 1080 may be configured to store the basic programming and data constructs that provide the functionality of the present disclosure.

Software code modules and instructions that provide the functionality of the present disclosure may be stored in RAM 1070 and disk drive 1080. These software modules may be executed by processor(s) 1060. RAM 1070 and disk drive 1080 may also provide a repository for storing data used in accordance with the present disclosure.

RAM 1070 and disk drive 1080 may include a number of memories including a main random access memory (RAM) for storage of instructions and data during program execution and a read only memory (ROM) in which fixed non-transitory instructions are stored. RAM 1070 and disk drive 1080 may include a file storage subsystem providing persistent (non-volatile) storage for program and data files. RAM 1070 and disk drive 1080 may also include removable storage systems, such as removable flash memory.

Bus subsystem 1090 provides a mechanism for letting the various components and subsystems of computer 1020 communicate with each other as intended. Although bus subsystem 1090 is shown schematically as a single bus, alternative embodiments of the bus subsystem may utilize multiple busses.

FIG. 10 is representative of a computer system capable of embodying the present disclosure. It will be readily apparent to one of ordinary skill in the art that many other hardware and software configurations are suitable for use with the present disclosure. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc.; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer-readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A memory device, comprising:
   a plurality of memory blocks, each memory block including multiple non-volatile memory cells, each memory block having a read threshold for reading the memory cells, wherein the plurality of memory blocks is partitioned into clusters of memory blocks based on read thresholds, wherein each cluster includes multiple memory blocks and a cluster mean read threshold, and each memory block belongs to a cluster where a distance between the read threshold of the memory block and the cluster mean read threshold is minimized; wherein each cluster is characterized by a cluster read threshold;
   a look-up table for storing information associating each cluster of memory blocks with a corresponding cluster read threshold;
   a parameter table for storing a plurality of status parameters for each memory block, the plurality of status parameters including a first count of cumulative read operations and a second count of cumulative write operations;
   wherein the memory device is configured to:
      receive a read command for reading a memory block with a first address;
      retrieve the plurality of status parameters associated with the memory block from the parameter table;
      select a cluster read threshold from the look-up table based on the plurality of status parameters and the first address; and
      use the selected cluster read threshold to read the memory block.

2. The memory device of claim 1, wherein the cluster read threshold is the cluster mean read threshold.

3. The memory device of claim 1, wherein the cluster read threshold is a read threshold selected to minimize an average raw bit error rate (eBER) of the cluster.

4. A memory device, comprising:
   a plurality of memory blocks, each memory block including multiple non-volatile memory cells, each memory block having a read threshold for reading the memory cells, wherein the plurality of memory blocks is partitioned into clusters of memory blocks based on read thresholds;
   a look-up table for storing information associating each cluster of memory blocks with a corresponding cluster read threshold;
   a parameter table for storing a plurality of status parameters for each memory block, the plurality of status parameters including a first count of cumulative read operations and a second count of cumulative write operations;
   wherein the memory device is configured to:
      receive a read command for reading a memory block with a first address;
      retrieve the plurality of status parameters associated with the memory block from the parameter table;

select a cluster read threshold from the look-up table based on the plurality of status parameters and the first address; and use the selected cluster read threshold to read the memory block;

wherein the clusters of memory blocks are formed using a distance metric $l_1=d(T_1, T_2)=\Sigma_{i=1}^{7}|t1_i-t2_i|$ between a first read threshold $T_1=[t1_1, t1_2, \ldots, t1_7]$ and a second read threshold $T_2=[t2_1, t2_2, \ldots, t2_7]$, each having seven read threshold voltage levels.

5. The memory device of claim 4, wherein the memory device is further configured to update the first count of cumulative read operations in the parameter table.

6. The memory device of claim 4, wherein each of the multiple non-volatile memory cells is a 3-bit non-volatile memory cell, and a read threshold comprises seven threshold voltage values.

7. The memory device of claim 4,
wherein the parameter table further comprises a cluster index for each memory block associated with the first address and the plurality of status parameters for the memory block; and
the memory device is configured to select a read threshold voltage from the look-up table based on the cluster index.

8. The memory device of claim 4, wherein the plurality of status parameters for each memory block further comprises a word line address.

9. The memory device of claim 4, wherein the plurality of status parameters for each memory block further comprises a count of erase/write cycles.

10. The memory device of claim 4, wherein the plurality of status parameters for each memory block further comprises a length of time since last read.

11. The memory device of claim 4, wherein the parameter table comprises an early retention indicator.

12. A memory device, comprising:
a plurality of memory blocks, each memory block including multiple non-volatile memory cells, each memory block having a read threshold for reading the memory cells, wherein the plurality of memory blocks is partitioned into clusters of memory blocks based on read thresholds;
a look-up table for storing information associating each cluster of memory blocks with a corresponding cluster read threshold;
a parameter table for storing a plurality of status parameters for each memory block, the plurality of status parameters including a first count of cumulative read operations and a second count of cumulative write operations;
wherein the memory device is configured to:
receive a read command for reading a memory block with a first address;
retrieve the plurality of status parameters associated with the memory block from the parameter table;
select a cluster read threshold from the look-up table based on the plurality of status parameters and the first address; and
use the selected cluster read threshold to read the memory block;
wherein the read threshold for each cluster is determined by minimizing an average rBER of each cluster:

$T_{opt}(k)=\arg\min {}_T\Sigma_i^{N(k)}(\text{rBER}(\text{LSB}(i))+\text{rBER}(\text{CSB}(i))+\text{rBER}(\text{MSB}(i)),$ wherein:
$T_{opt}(k)$ is an optimum read threshold for the cluster;
rBER is raw bit error rate;
"arg min" is "argument of the minimum," which is a function that determines a value of read threshold T for which the bit error rate for the cluster as defined above is minimum;
N(k) is a number of word lines in the k-th cluster;
LSB refers to least significant bit;
CSB refers to center significant bit; and
MSB refers to most significant bit.

13. A memory device, comprising: a plurality of memory blocks, each block with multiple memory cells, each memory block having an address and a block read threshold, wherein the plurality of memory blocks is partitioned into clusters based on block read thresholds, wherein each cluster includes multiple memory blocks and a cluster mean read threshold, and each memory block belongs to a cluster where a distance between the read threshold of the memory block and the cluster mean read threshold is minimized; wherein each cluster is characterized by a cluster read threshold;
a look-up table for storing information associating each cluster of memory blocks with a corresponding cluster read threshold, the look-up table further including cluster boundaries defined in values of device status parameters;
wherein the memory device is configured to:
receive a read command to read a memory block with a read address;
identify a cluster for the memory block with the read address;
select a cluster read threshold for the identified cluster from the look-up table; and
use the selected cluster read threshold to perform a read operation of the memory block.

14. The memory device of claim 13, further comprising a parameter table for storing a plurality of device status parameters for each memory block.

15. The memory device of claim 14, wherein the memory device is further configured to update a device status parameter in the parameter table.

16. The memory device of claim 14, wherein the plurality of device status parameters in the parameter table includes a first count of cumulative first memory operations and a second count of cumulative second memory operations.

17. The memory device of claim 14, wherein the plurality of device status parameters for each memory block further comprises length of time since last operation.

18. The memory device of claim 13, wherein the memory device is configured to identify a cluster for a memory block by:
obtaining a plurality of status parameters associated with the memory block; and
identifying the cluster from the look-up table based on the plurality of status parameters associated with the memory block.

19. The memory device of claim 13, wherein the memory device is configured to identify the cluster for a memory block by:
obtaining a cluster index associated with the read address; and
identifying the cluster from the look-up table based on the cluster index.

20. A method for hard-read of a flash memory, comprising:
performing read operations of a plurality of memory blocks using different read thresholds to determine an optimum block read threshold for each memory block, each memory block characterized by multiple status parameters;

clustering the plurality of memory blocks into a group of clusters according to the optimum block read threshold for each memory block, wherein each cluster includes multiple memory blocks and a cluster mean read threshold, and each memory block belongs to a cluster where a distance between the optimum block read threshold of the memory block and the cluster mean read threshold is minimized;

for each cluster, determining a cluster read threshold; and for each cluster, identifying cluster boundaries in values of the status parameters.

21. The method of claim 20, further comprising;

receiving a read command with an address for a memory block;

identifying a cluster index for the memory block;

identifying a cluster read threshold associated with the cluster index; and performing a read operation of the memory block using the cluster read threshold.

22. The method of claim 20, further comprising:

receiving a read command with an address for a memory block;

identifying a cluster index for the memory block based on the status parameters of the memory block;

identifying a cluster read threshold associated with the cluster index; and performing a read operation of the memory block using the cluster read threshold.

23. The method of claim 20, further comprising:

forming a parameter table for storing a plurality of status parameters for each memory block, the plurality of status parameters including a first count of cumulative read operations and a second count of cumulative write operations; and forming a look-up table for storing information associating each cluster of memory blocks with a corresponding cluster read threshold, wherein the plurality of memory blocks is partitioned into clusters of memory blocks based on read threshold.

24. The method of claim 23, further comprising updating a status parameter associated with a read operation.

25. The method of claim 20, wherein determining an optimum read threshold for each memory block comprises selecting a read threshold for minimizing a raw bit error rate (rBER).

* * * * *